US011445602B2

(12) United States Patent
Hiratani et al.

(10) Patent No.: US 11,445,602 B2
(45) Date of Patent: Sep. 13, 2022

(54) FLEXIBLE CIRCUIT BOARD ON BUS BARS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shungo Hiratani, Yokkaichi (JP); Shinsuke Okumi, Yokkaichi (JP); Arinobu Nakamura, Yokkaichi (JP); Akira Haraguchi, Yokkaichi (JP); Heng Cao, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/260,874

(22) PCT Filed: Jul. 12, 2019

(86) PCT No.: PCT/JP2019/027781

§ 371 (c)(1),
(2) Date: Jan. 15, 2021

(87) PCT Pub. No.: WO2020/017471

PCT Pub. Date: Jan. 23, 2020

(65) Prior Publication Data

US 2021/0267048 A1 Aug. 26, 2021

(30) Foreign Application Priority Data

Jul. 18, 2018 (JP) ............................ JP2018-135248

(51) Int. Cl.
*H05K 1/18* (2006.01)
*H05K 1/02* (2006.01)
*H05K 1/11* (2006.01)

(52) U.S. Cl.
CPC ......... *H05K 1/0271* (2013.01); *H05K 1/0277* (2013.01); *H05K 1/118* (2013.01); *H05K 1/181* (2013.01); *H05K 2201/068* (2013.01)

(58) Field of Classification Search
CPC .... H05K 1/0271; H05K 1/0277; H05K 1/118; H05K 1/181; H05K 2201/068
(Continued)

(56) References Cited

U.S. PATENT DOCUMENTS

2014/0370343 A1 12/2014 Nomoto et al.
2017/0006718 A1* 1/2017 Haraguchi .......... B60R 16/0238
(Continued)

FOREIGN PATENT DOCUMENTS

JP 2010-22117 A 1/2010
JP 2016-220277 A 12/2016

OTHER PUBLICATIONS

International Search Report, Application No. PCT/JP2019/027781, dated Oct. 1, 2019. ISA/Japan Patent Office.

*Primary Examiner* — Binh B Tran
(74) *Attorney, Agent, or Firm* — Honigman LLP

(57) ABSTRACT

A power circuit includes bus bars that are connected to terminals of an FET and are provided flush with each other, and a first insulation region arranged between the bus bars. The power circuit includes a bus bar to which the FET is fixed, a conductive sheet that is connected to another bus bar via a first connection portion and electrically connects source terminals of the FET to the other bus bar, and a
(Continued)

second connection portion that is provided in the conductive sheet and electrically connects the source terminals to the other bus bar.

14 Claims, 6 Drawing Sheets

(58) Field of Classification Search
USPC .......................................................... 361/749
See application file for complete search history.

(56) References Cited

U.S. PATENT DOCUMENTS

| | | | | |
|---|---|---|---|---|
| 2018/0006441 | A1* | 1/2018 | Sumida .................. | H05K 7/205 |
| 2018/0368249 | A1* | 12/2018 | Chin ....................... | B60R 16/02 |
| 2019/0014654 | A1* | 1/2019 | Kobayashi ........... | H05K 7/1427 |
| 2019/0081468 | A1 | 3/2019 | Chin et al. | |

* cited by examiner

FLEXIBLE CIRCUIT BOARD ON BUS BARS

CROSS-REFERENCE TO RELATED APPLICATIONS

This application is the U.S. national stage of PCT/JP2019/027781 filed on Jul. 12, 2019, which claims priority of Japanese Patent Application No. JP 2018-135248 filed on Jul. 18, 2018, the contents of which are incorporated herein.

TECHNICAL FIELD

The present disclosure relates to a circuit board.

BACKGROUND

Conventionally, in a commonly-known circuit board, a conductive pattern for forming a circuit for conducting a relatively small current is formed on a substrate, and conductive members (also called bus bars or the like) for forming circuits for conducting a relatively large current are fixed to the substrate.

JP 2016-220277A discloses an electrical connection box that includes a pair of bus bars, power semiconductors mounted on the pair of bus bars, a control substrate for mounting a control unit that controls the power semiconductors, and an FPC that is arranged on the upper surfaces of the pair of bus bars and electrically connects control terminals of the power semiconductors to the control substrate.

With a circuit board such as that described above, a large amount of heat is emitted by the conductive members due to conducting a large current, and also by the connection member that connects the conductive members to an electronic component. Not only does the generated heat cause thermal damage such as disconnection of the connection member, but there is also a risk of secondary thermal damage to surrounding electronic components or the like.

However, no innovation to address such a problem is made in the electrical connection box disclosed in JP 2016-220277A.

In view of this, an object of the present disclosure is to provide a circuit board that can suppress the generation of heat in a connection member that connects a conductive piece and a semiconductor element, and can also prevent a fault caused by the generation of heat in the connection member.

SUMMARY

A circuit board according to an aspect of the present disclosure includes a plurality of conductive pieces that are connected to terminals of a semiconductor element and are provided flush with each other, and an insulation region arranged between the conductive pieces, the circuit board further including: a first conductive piece to which the semiconductor element is fixed; a conductive sheet that is connected to a second conductive piece via a first connection portion and electrically connects a first terminal of the semiconductor element to the second conductive piece; and a second connection portion that is provided in the conductive sheet and electrically connects the first terminal and the second conductive piece.

Advantageous Effects of the Present Disclosure

According to the present disclosure, it is possible to suppress the generation of heat in a connection member that connects a conductive piece and a semiconductor element, and also prevent a fault caused by the generation of heat in the connection member.

DETAILED DESCRIPTION OF PREFERRED EMBODIMENTS

Figure 1:
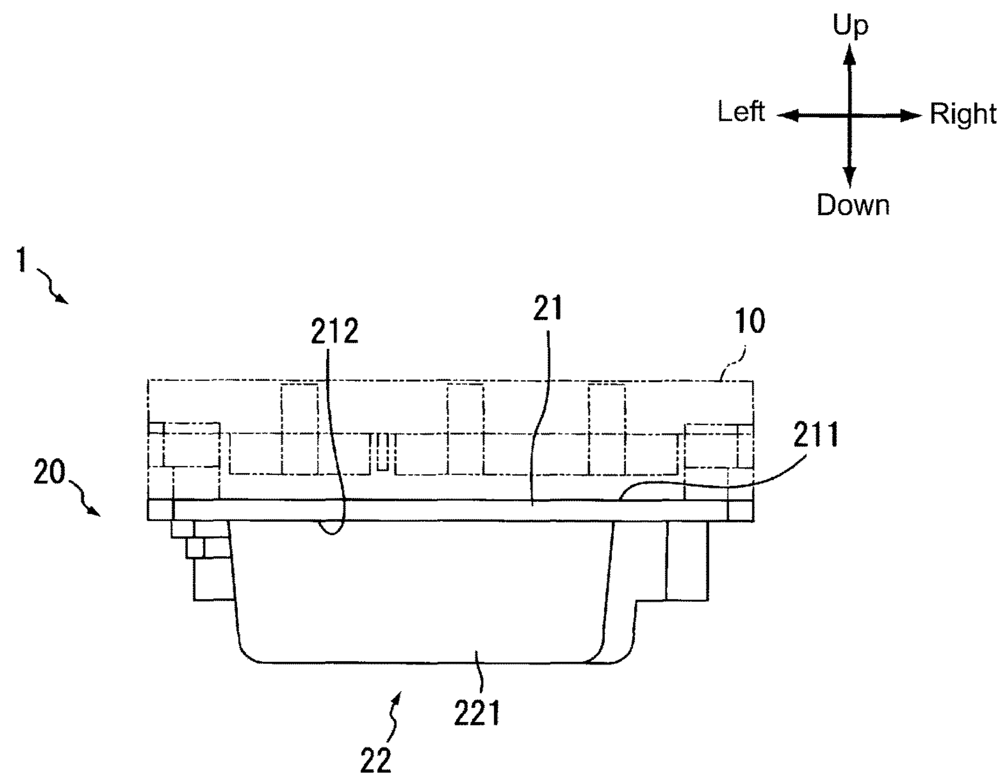
FIG. 1 is a front view of an electrical apparatus according to an embodiment.

First, embodiments of the present disclosure will be listed and described. The embodiments described below may be at least partially combined with each other as desired.

A circuit board according to an aspect of the present disclosure includes a plurality of conductive pieces that are connected to terminals of a semiconductor element and are provided flush with each other, and an insulation region arranged between the conductive pieces, the circuit board further including: a first conductive piece to which the semiconductor element is fixed; a conductive sheet that is connected to a second conductive piece via a first connection portion and electrically connects a first terminal of the semiconductor element to the second conductive piece; and a second connection portion that is provided in the conductive sheet and electrically connects the first terminal and the second conductive piece.

In this aspect, the conductive sheet is connected to the second conductive piece via the first connection portion as well as the second connection portion.

Accordingly, the path for current between the first terminal of the semiconductor element and the second conductive piece is larger, and the first terminal can be reliably electrically connected to the second conductive piece.

In the circuit board according to another aspect of the present disclosure, the conductive sheet includes a conductive portion that electrically connects the first terminal and the second conductive piece, and an insulation sheet that insulates the conductive portion from at least the first conductive piece, and the second connection portion includes a recession portion formed such that the conductive portion is exposed therein, and an inner conductive portion that is provided inside the recession portion and electrically connects the conductive portion and the second conductive piece.

In this aspect, in the second connection portion, the conductive portion is connected to the second conductive piece via the inner conductive portion inside the recession portion.

Accordingly, the first terminal of the semiconductor element and the second conductive piece can be electrically connected via the first connection portion as well as the second connection portion, and the first terminal can be reliably electrically connected to the second conductive piece.

In the circuit board according to another aspect of the present disclosure, the second connection portion is provided in a vicinity of the insulation region.

In this aspect, the second connection portion is provided in the vicinity of the insulation region, thus making it possible minimize the length of the conductive sheet that forms the path for current between the first terminal of the semiconductor element and the second conductive piece, and making it possible to lower the resistance in the conductive sheet.

In the circuit board according to another aspect of the present disclosure, the inner conductive portion is an annular portion formed on an inward surface of the recession portion.

In this aspect, in the second connection portion, the conductive portion is electrically connected to the second conductive piece via the inner conductive portion that is an annular portion.

Accordingly, heat generated in the conductive sheet (conductive portion) is transmitted to the second conductive piece via the second connection portion (inner conductive portion), and it is possible to prevent a fault caused by the generation of heat in the conductive sheet. Also, because the inner conductive portion is an annular portion, an air cooling effect can be expected.

In the circuit board according to another aspect of the present disclosure, the inner conductive portion is solder that has been welded to the conductive portion and the second conductive piece.

In this aspect, in the second connection portion, the conductive portion is electrically connected to the second conductive piece via the inner conductive portion that is a clump of solder.

Accordingly, heat generated in the conductive sheet (conductive portion) is transmitted to the second conductive piece via the second connection portion (inner conductive portion), and it is possible to prevent a fault caused by the generation of heat in the conductive sheet. Also, the area of contact between the inner conductive portion and the second conductive piece increases, and the transmission of heat and the flow of current improve.

In the circuit board according to another aspect of the present disclosure, the conductive portion is plate-shaped.

In this aspect, the conductive portion is plate-shaped, thus making it possible to lower the resistance and suppress the generation of heat in the conductive sheet (conductive portion).

In the circuit board according to another aspect of the present disclosure, the conductive sheet is an FPC (Flexible Printed Circuit).

In this aspect, an FPC is used as the conductive sheet. This therefore makes it possible to simplify the process of manufacturing the circuit board.

Hereinafter, embodiments of the present disclosure will be described in detail with reference to the drawings. The following describes a circuit board according to an embodiment of the present disclosure with reference to the drawings. Note that the present disclosure is not limited to the following examples, but rather is defined by the claims, and all changes that come within the meaning and range of equivalency of the claims are intended to be embraced therein.

The following description is given by way of example of an electrical apparatus that includes a circuit board according to an embodiment.

First Embodiment

FIG. 1 is a front view of an electrical apparatus 1 according to the present embodiment.

The electrical apparatus 1 constitutes an electrical connection box for arrangement on a power supply path between a power supply such as a battery included in a vehicle and a load such as a motor or a vehicular electrical component such as a lamp or a wiper. The electrical apparatus 1 is used as an electronic component such as a DC-DC converter or an inverter.

Figure 2:
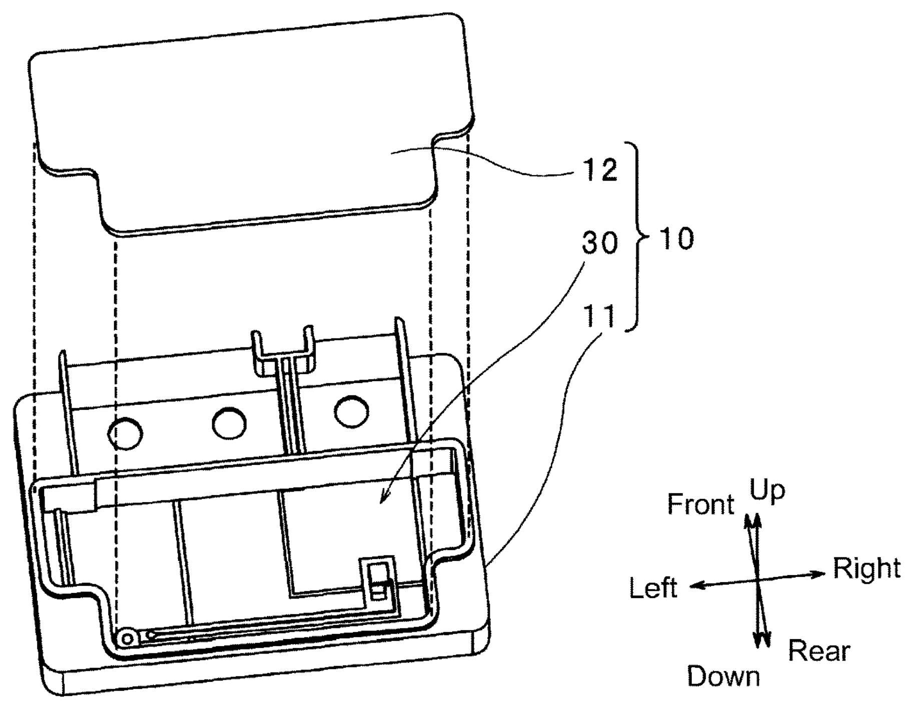
FIG. 2 is an exploded view of a substrate structure of the electrical apparatus of the embodiment.

The electrical apparatus 1 includes a substrate structure 10 and a support member 20 that supports the substrate structure 10. FIG. 2 is an exploded view of the substrate structure 10 of the electrical apparatus 1 of the present embodiment.

In the present embodiment, for the sake of convenience, “front”, “rear”, “left”, “right”, “up”, and “down” with respect to the electrical apparatus 1 are defined by the front-rear, left-right, and up-down directions shown in FIGS. 1 and 2. The front-rear, left-right, and up-down directions used in the following description are defined as mentioned above.

The substrate structure 10 includes a power circuit 30 (circuit board) and a control circuit 12 that turns the power circuit 30 on and off for example, and the power circuit 30 includes bus bars that form power circuits, and a semiconductor element that is mounted on the bus bars. The semiconductor element is appropriately mounted according to the application of the electrical apparatus 1, and may be a resistor, a coil, a capacitor, or a switching element such as an FET (Field Effect Transistor).

The support member 20 includes a base portion 21 that includes a support surface 211 on the upper side for supporting the substrate structure 10, a heat dissipation portion 22 that is provided on the surface on the side opposite to the support surface 211 (i.e., provided on a lower surface 212), and multiple leg portions (not shown) that are provided at the left and right ends of the base portion 21 on opposite sides of the heat dissipation portion 22. The base portion 21, the heat dissipation portion 22, and the leg portions of the support member 20 are integrally formed by, for example, performing die casting using a metal material such as aluminum or an aluminum alloy.

The base portion 21 is a flat plate member that is rectangular and has an appropriate thickness. The substrate structure 10 is fixed to the support surface 211 of the base portion 21 using a known method such as adhesion, screwing, or soldering.

The heat dissipation portion 22 includes multiple heat dissipation fins 221 that project downward from the lower surface 212 of the base portion 21 such that heat generated by the substrate structure 10 is dissipated outward. The heat dissipation fins 221 extend in the left-right direction and are arranged parallel with gaps therebetween in the front-back direction.

Figure 3:
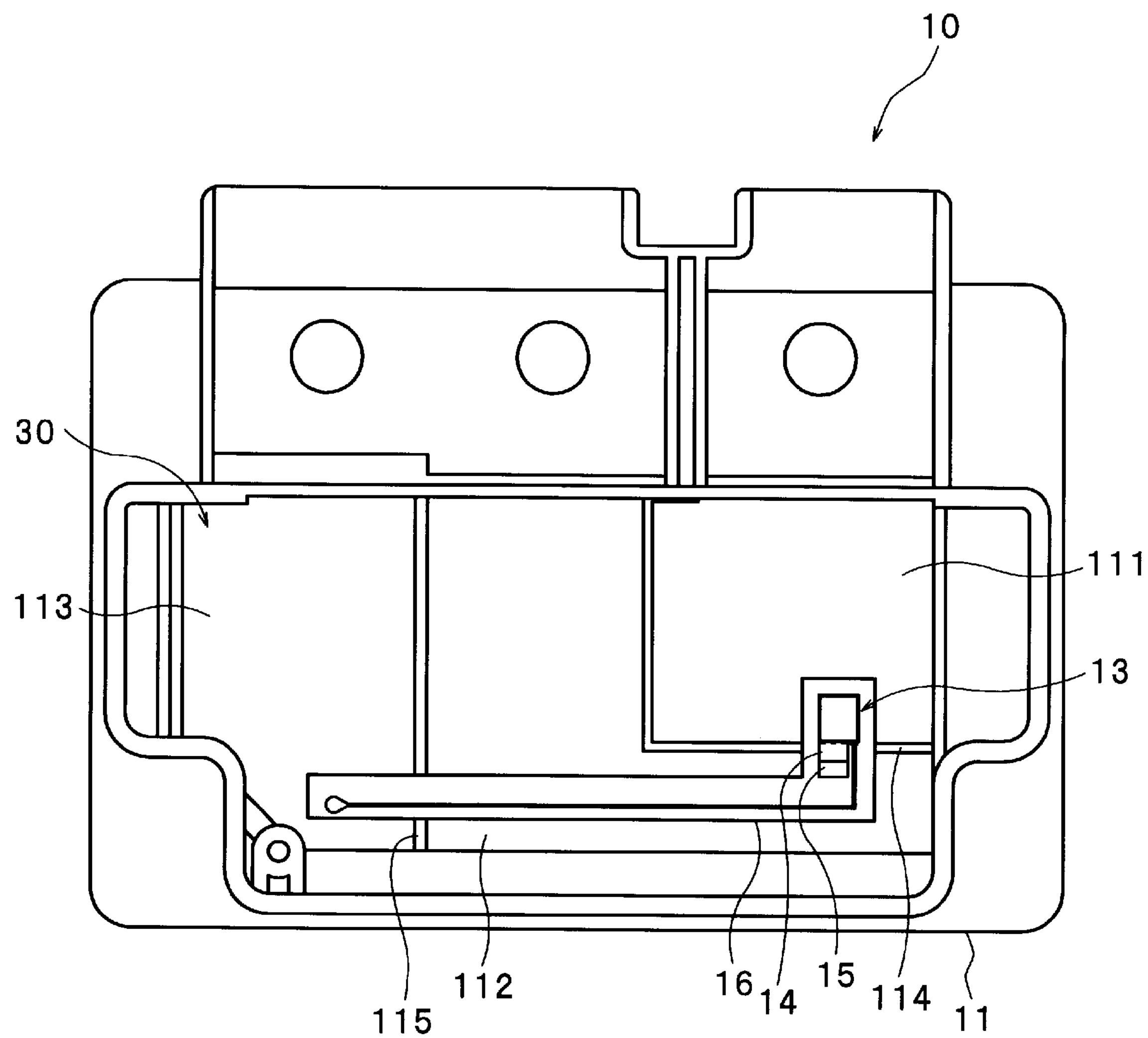
FIG. 3 is a plan view of the substrate structure of the electrical apparatus of the embodiment, as seen from above.

FIG. 3 is a plan view of the substrate structure 10 of the electrical apparatus 1 of the present embodiment, as seen from above. For convenience in the description, FIG. 3 shows the substrate structure 10 in a state where the control circuit 12 has been removed.

The substrate structure 10 includes the power circuit 30, the control circuit 12 for mounting a control circuit that applies on/off signals to the power circuit 30, and a housing portion 11 that houses the power circuit 30 and the control circuit 12. The control circuit 12 and the power circuit 30 are provided at locations separated from each other.

The power circuit 30 includes at least bus bars 111 and 112 (conductive pieces) and a semiconductor switching element 13 (semiconductor element) that receives a control signal from the control circuit 12 and switches between a conductive/non-conductive state based on the received control signal.

In the power circuit 30, the bus bars 111 and 112 are provided flush with each other, and a substrate portion 113 having a circuit pattern or the like is also provided flush with the bus bar 111 and 112. A first insulation region 114 is arranged between the bus bar 111 and the bus bar 112, and a second insulation region 115 is arranged between the bus bar 112 and the substrate portion 113.

The bus bar 111 is rectangular plate-shaped, and the bus bar 112 is provided so as to be near two adjacent sides of the bus bar 111. Similarly to the bus bar 111, the bus bar 112 is also plate-shaped. The bus bar 112 is arranged between the substrate portion 113 and the bus bar 111. The bus bar 111 and the bus bar 112 are conductive plate members formed by a metal material such as copper or a copper alloy.

The first insulation region 114 and the second insulation region 115 are manufactured by performing insert molding with use of an insulating resin material such as phenol resin or a glass epoxy resin. The first insulation region 114 and the second insulation region 115 may be formed integrally with the housing portion 11, for example.

The semiconductor switching element 13 is an FET (more specifically, a surface mount type power MOSFET) for example, and is arranged on the bus bar 111 or the bus bar 112. Specifically, in the power circuit 30 according to the present embodiment, the semiconductor switching element 13 (hereinafter referred to as the FET 13) is not arranged so as to straddle the bus bar 111 and the bus bar 112, but rather is fixed to either the bus bar 111 or the bus bar 112. In the present embodiment, for the sake of convenience in the description, the following describes the case where the FET 13 is fixed to the bus bar 111.

Also, in addition to the FET 13, semiconductor elements such as Zener diodes are mounted on the bus bars 111 and 112.

Note that although only one FET 13 is mounted in the configuration in the example shown in FIG. 3 for the sake of convenience in the description, there is no limitation to this, and it goes without saying that multiple FETs 13 may be mounted.

Figure 4:
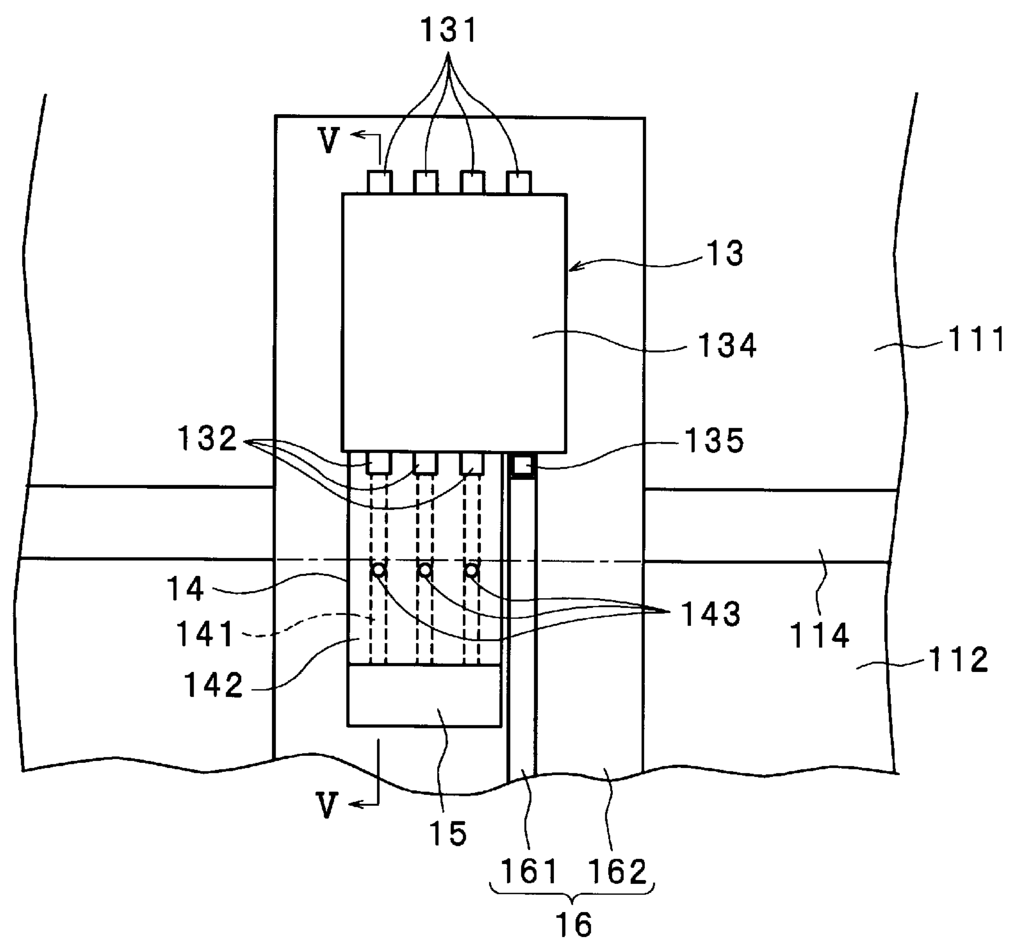
FIG. 4 is an enlarged view of a region that includes an FET in FIG. 3.
Figure 5:
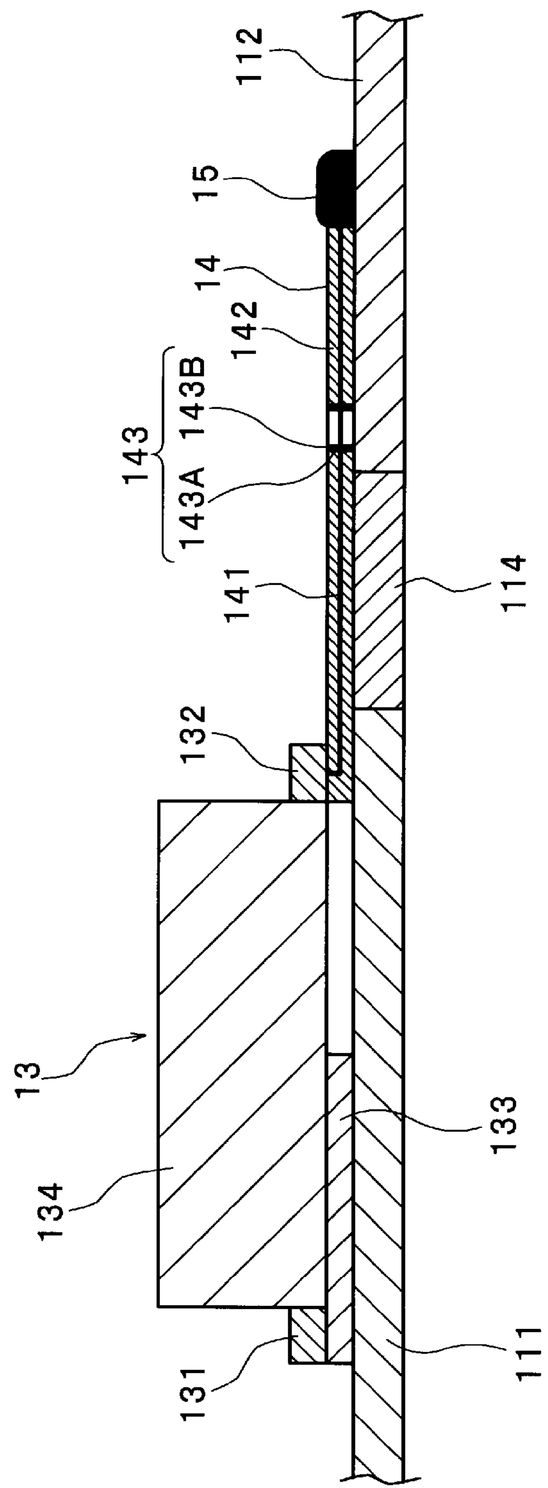
FIG. 5 is a longitudinal sectional view taken along a line V-V in FIG. 4.

FIG. 4 is an enlarged view of a region that includes the FET 13 in FIG. 3, and FIG. 5 is a longitudinal sectional view taken along a line V-V in FIG. 4.

The FET 13 includes an element main body 134 as well as four drain terminals 131 and three source terminals 132 that are arranged on mutually opposite sides of the element main body 134. For example, the drain terminals 131 are provided on one lateral surface of the element main body 134, and the source terminals 132 are provided on the opposing lateral surface. The FET 13 also includes a gate terminal 135, and the gate terminal 135 is provided in the vicinity of the source terminals 132, for example. However, the position of the gate terminal 135 is not limited to this example.

In the present embodiment, the case where the FET 13 is fixed to the bus bar 111 and the source terminals 132 are electrically connected to the bus bar 112 via a conductive sheet 14 is described as an example, but the present disclosure is not limited to this. A configuration is possible in which the FET 13 is fixed to the bus bar 112, and the drain terminals 131 are electrically connected to the bus bar 111 via the conductive sheet 14.

The drain terminals 131, the source terminals 132, and the gate terminal 135 extend in a straight line outward from the element main body 134. The drain terminals 131, the source terminals 132, and the gate terminal 135 do not have a bent portion, thus suppressing the lengths to the extending ends, and achieving compactness for the power circuit 30.

The FET 13 is fixed to the bus bar 111 by soldering. Specifically, solder fixing portions 133 are arranged between the bottom face of the FET 13 and the bus bar 111. The solder fixing portions 133 solder at least a portion of the bottom face of the FET 13 to the bus bar 111.

The drain terminals 131 of the FET 13 are soldered to the solder fixing portions 133, and are electrically connected to the bus bar 111 via the solder fixing portions 133. In other words, the drain terminals 131 are directly electrically connected to the bus bar 111.

On the other hand, the source terminals 132 of the FET 13 are electrically connected to the bus bar 112, which is on the other side of the first insulation region 114, via the conductive sheet 14. In other words, the conductive sheet 14 is provided on the bus bars 111 and 112 so as to extend across the first insulation region 114.

The conductive sheet 14 includes linear conductive portions 141 (shown by dashed lines in FIG. 4), which electrically connect the source terminals 132 to the bus bar 112, and an insulation portion 142 (insulation sheet) that insulates the conductive portions 141 from the bus bar 111. Ends of the conductive portions 141 on one side are soldered to corresponding source terminals 132, and the ends of the conductive portions 141 on the other side are soldered to the bus bar 112. In other words, the other end of the conductive sheet 14 is electrically connected to the bus bar 112 via a first connection portion 15.

As one example, the conductive portions 141 are made of copper foil, the insulation portion 142 is made of a resin sheet, and the conductive portions 141 are embedded in the insulation portion 142. The conductive sheet 14 may be an FPC (Flexible Printed Circuit), for example.

There is no limitation to this, and the conductive portions 141 may be adhered to the insulation portion 142.

In addition to the first connection portion 15, second connection portions 143 for electrically connecting the source terminals 132 to the bus bar 112 are provided in the conductive sheet 14 in one-to-one correspondence with the conductive portions 141. The second connection portions 143 are provided inside the conductive sheet 14 at positions that match the conductive portions 141 in the thickness direction of the conductive sheet 14.

The second connection portions 143 each have a recession portion 143A that extends from the surface of the conductive sheet 14 on the bus bar 111 and 112 side to at least a portion of the conductive portion 141 in the thickness direction of the conductive sheet 14. Specifically, the recession portions 143A are formed such that portions of the insulation portion 142 that include the conductive portions 141 are removed, and therefore the conductive portions 141 are exposed inside the recession portions 143A. The recession portions 143A may be through-holes that pass through the conductive sheet 14 in the thickness direction, for example. In the present embodiment, the case where the recession portions 143A are circular through-holes is described.

The second connection portions 143 include inner conductive portions 143B that are provided inside the recession portions 143A and electrically connect the conductive portions 141 to the bus bar 112. For example, the inner conductive portions 143B are annular portions formed on the inward surfaces of the recession portions 143A.

Specifically, the inner conductive portions 143B may be a conductive layer formed by performing plating processing on the inward surfaces of the recession portions 143A, or may be cylindrical conductors whose outer diameter is the same as the inner diameter of the recession portions 143A and which have been fitted into the recession portions 143A.

In the present embodiment, the case where the inner conductive portions 143B are cylindrical is described, but there is no limitation to this, and they may be shaped as rectangular tubes.

In this way, the conductive portions 141 are exposed inside the recession portions 143A, and the annular inner conductive portions 143B are provided on the inward surfaces of the recession portion 143A, and therefore the conductive portions 141 are electrically connected to the bus bar 112 via the inner conductive portions 143B.

As shown in FIG. 4, the second connection portions 143 are provided in the vicinity of the first insulation region 114. For the sake of convenience, a portion of the first insulation region 114 hidden by a later-described extended connection sheet 16 is shown by a dashed-dotted line in FIG. 4. As one example, the second connection portions 143 are separated from the first insulation region 114 by approximately 30% of the diameter of the second connection portions 143.

Also, the gate terminal 135 of the FET 13 is electrically connected to a distant substrate portion 113 by the bus bar 112 via an extended connection sheet 16. The extended connection sheet 16 is provided on the bus bars 111 and 112, and extends from the bus bar 111, over the bus bar 112, to the substrate portion 113.

The extended connection sheet 16 includes a conductive wire 161 that electrically connects the gate terminal 135 and the substrate portion 113, and an insulation sheet 162 that insulates the conductive wire 161 from the bus bars 111 and 112.

One end of the conductive wire 161 is soldered to the gate terminal 135, and the other end of the conductive wire 161 is soldered to a circuit pattern (not shown) of the substrate portion 113. The conductive wire 161 is made of a copper wire or copper foil, and the insulation sheet 162 is made of a resin. The insulation sheet 162 is adhered to the bus bars 111 and 112 along the conductive wire 161. The insulation sheet 162 covers a region including the conductive wire 161 and also a predetermined range of the bus bars 111 and 112 that includes the FET 13 region.

As one example, the substrate portion 113 may be configured such that an insulated substrate is provided, a control circuit (not shown) that includes semiconductor elements such as resistors, coils, capacitors, and diodes is mounted on the upper surface of the insulated substrate, and a circuit pattern that electrically connects the semiconductor elements is also formed on the upper surface.

As described above, in the power circuit 30 according to the present embodiment, the source terminals 132 and the bus bar 112 are electrically connected by the conductive sheet 14, and the conductive sheet 14 is connected to the bus bar 112 via the first connection portions 15 as well as the second connection portions 143.

Accordingly, the path for current between the source terminals 132 and the bus bar 112 is larger, and the source terminals 132 are reliably electrically connected to the bus bar 112.

Also, because the second connection portions 143 are provided on the bus bar 112 at positions in the vicinity of the first insulation region 114, it is possible to minimize the lengths of the paths for current between the source terminals 132 and the bus bar 112. Accordingly, it is possible to lower the resistance and suppress the generation of heat in the conductive sheet 14.

Note that the conductive portions 141 and the bus bar 112 are connected to each other via the second connection portions 143 (inner conductive portions 143B). Accordingly, heat generated in the conductive sheet 14 (conductive portions 141) is transmitted to the bus bar 112 via the second connection portions 143 (inner conductive portions 143B). Accordingly, it is possible to prevent a fault caused by the generation of heat in the conductive sheet 14, and heat can be dispersed from the conductive sheet 14 to the bus bar 112, thus making it possible to improve the efficiency of heat dissipation.

Second Embodiment

Figure 6:
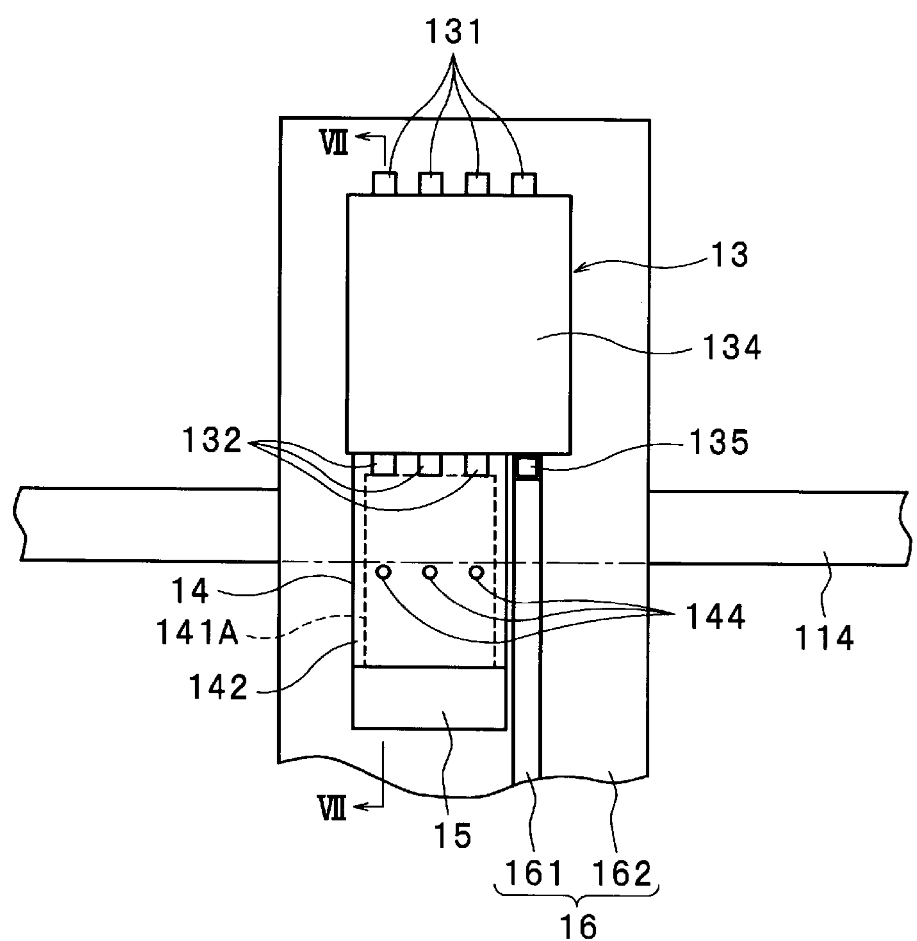
FIG. 6 is an enlarged view of the region that includes the FET in a power circuit according to the embodiment.
Figure 7:
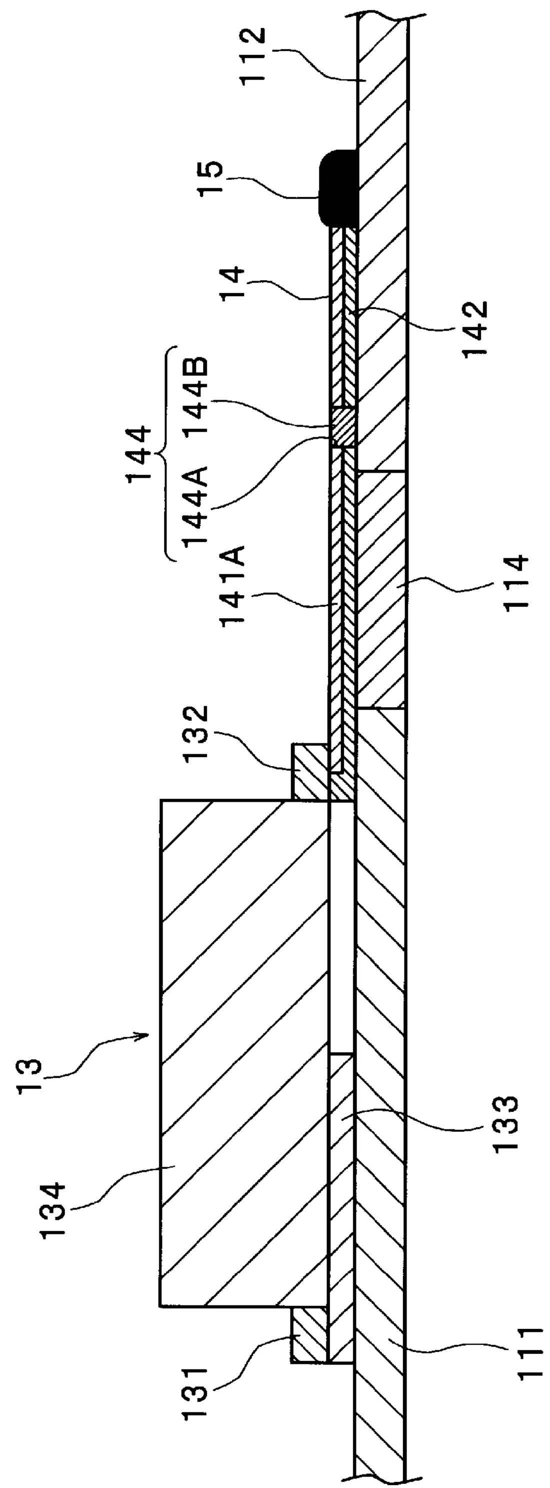
FIG. 7 is a longitudinal sectional view taken along a line VII-VII in FIG. 6.

FIG. 6 is an enlarged view of a region that includes the FET 13 in the power circuit 30 according to the present embodiment, and FIG. 7 is a longitudinal sectional view taken along a line VII-VII in FIG. 6.

The FET 13 is fixed to the bus bar 111, and the source terminals 132 are electrically connected to the bus bar 112 via the conductive sheet 14.

The FET 13 is fixed to the bus bar 111 by soldering. Specifically, solder fixing portions 133 are arranged between the bottom face of the FET 13 and the bus bar 111. The drain terminals 131 are directly electrically connected to the bus bar 111.

On the other hand, the source terminals 132 of the FET 13 are electrically connected to the bus bar 112 via the conductive sheet 14. In other words, the conductive sheet 14 is provided on the bus bars 111 and 112 so as to extend across the first insulation region 114.

The conductive sheet 14 includes a conductive portion 141A (shown by dashed lines in FIG. 6), which electrically connects the source terminals 132 to the bus bar 112, and the insulation portion 142 (insulation sheet) that insulates the conductive portion 141A from the bus bar 111. One end of the conductive portion 141A is soldered to the source terminals 132, and the other end of the conductive portion 141A is soldered to the bus bar 112 via the first connection portion 15.

As one example, the conductive portion 141A is made of copper foil and is rectangular plate-shaped. Also, the insulation portion 142 is made of a resin sheet. The insulation portion 142 is arranged between the conductive portion 141A and the bus bars 111 and 112, and the conductive portion 141A has a smaller area than the insulation portion 142. The conductive sheet 14 may be an FPC (Flexible Printed Circuit), for example.

In addition to the first connection portion 15, three second connection portions 144 for electrically connecting the source terminals 132 to the bus bar 112 are provided in the conductive sheet 14. The second connection portions 144 are provided inside the conductive sheet 14 at positions that match the conductive portion 141A in the thickness direction of the conductive sheet 14.

The second connection portions 144 each have a recession portion 144A that extends from the surface of the conductive sheet 14 on the bus bar 111 and 112 side to at least a portion of the conductive portion 141A in the thickness direction of the conductive sheet 14. Specifically, the recession portions 144A are formed such that portions of the insulation portion 142 that include the conductive portion 141A are removed, and therefore the conductive portion 141A is exposed inside the recession portions 144A. The recession portions 144A may be through-holes that pass through the conductive sheet 14 in the thickness direction, for example. In the present embodiment, the case where the recession portions 144A are circular through-holes is described.

The second connection portions 144 include inner conductive portions 144B that are provided inside the recession portions 144A and electrically connect the conductive portion 141A to the bus bar 112. For example, the inner conductive portions 144B are constituted by solder formed on the inward surfaces of the recession portions 144A.

Specifically, the inner conductive portions 144B are clumps of solder welded to the conductive portion 141A and the bus bar 112 by soldering, and are shaped resembling the recession portions 144A. In other words, the inner conductive portions 144B are shaped as circular columns whose outer diameter is the same as the inner diameter of the recession portions 144A, and are fitted inside the recession portions 144A.

In this way, the conductive portion 141A is exposed inside the recession portions 144A, and the inner conductive portions 144B, which are clumps of solder, are fitted into the recession portions 144A, and therefore the conductive portion 141A and the bus bar 112 are electrically connected via the inner conductive portions 144B.

As shown in FIG. 6, the second connection portions 144 are provided in the vicinity of the first insulation region 114. For the sake of convenience, a portion of the first insulation region 114 hidden by the extended connection sheet 16 is shown by a dashed-dotted line in FIG. 6.

Also, the gate terminal 135 of the FET 13 is electrically connected to the distant substrate portion 113 by the bus bar 112 via the extended connection sheet 16. As one example, a configuration is possible in which the substrate portion 113 includes an insulated substrate, and a control circuit (not shown) that includes semiconductor elements such as resistors, coils, capacitors, and diodes is mounted on the upper surface of the insulated substrate.

The extended connection sheet 16 and the substrate portion 113 have the same configurations as in the first embodiment, and therefore will not be described in detail.

As described above, in the power circuit 30 according to the present embodiment, the source terminals 132 and the bus bar 112 are electrically connected by the conductive sheet 14, and the conductive sheet 14 is connected to the bus bar 112 via the first connection portions 15 as well as the second connection portions 144.

Accordingly, the path for current between the source terminals 132 and the bus bar 112 is larger, and the source terminals 132 are reliably electrically connected to the bus bar 112.

Also, because the second connection portions 144 are provided on the bus bar 112 at positions in the vicinity of the first insulation region 114, it is possible to minimize the lengths of the paths for current between the source terminals 132 and the bus bar 112. Accordingly, it is possible to lower the resistance and suppress the generation of heat in the conductive sheet 14.

Also, because the conductive portion 141A is plate-shaped, it is possible to suppress the resistance when electricity is conducted between the source terminals 132 and the bus bar 112, thus making it possible to suppress the generation of heat in the conductive sheet 14.

Also, because the conductive portion 141A is plate-shaped, the area of contact with the air increases, and the generation of heat in the conductive sheet 14 can be suppressed by air cooling.

Note that the conductive portion 141A and the bus bar 112 are connected to each other via the second connection portions 144 (inner conductive portions 144B). Accordingly, heat generated in the conductive sheet 14 (conductive portion 141A) is transmitted to the bus bar 112 via the second connection portions 144 (inner conductive portions 144B). Accordingly, it is possible to prevent a fault caused by the generation of heat in the conductive sheet 14, and heat can be dispersed from the conductive sheet 14 to the bus bar 112, thus making it possible to improve the efficiency of heat dissipation.

Although the case where three second connection portions 144 are provided in the conductive sheet 14 is described as an example above, there is no limitation to this. The number of second connection portions 144 may be more than three, and an increase makes it possible to improve the above-described effect.

In the first embodiment and the second embodiment, examples are described in which the FET 13 is fixed to the bus bar 111, the drain terminals 131 of the FET 13 are directly connected to the bus bar 111, and the source terminals 132 of the FET 13 are connected to the bus bar 112 via the conductive sheet 14. However, the embodiments are not limited to this configuration. A configuration is possible in which the FET 13 is fixed to the bus bar 112, the source terminals 132 of the FET 13 are directly connected to the bus bar 112, and the drain terminals 131 of the FET 13 are connected to the bus bar 111 via the conductive sheet 14.

Also, the second connection portions 143 (inner conductive portions 143B) of the first embodiment may be applied to the conductive sheet 14 of the second embodiment, and the second connection portions 144 (inner conductive portions 144B) of the second embodiment may be applied to the conductive sheet 14 of the first embodiment.

The embodiments disclosed here are to be considered in all respects as illustrative and not limiting. The scope of the present disclosure is indicated by the claims rather than by the foregoing description, and all changes which come within the meaning and range of equivalency of the claims are intended to be embraced therein.

The invention claimed is:

1. A circuit board including a plurality of conductive pieces that are connected to terminals of a semiconductor element and are provided flush with each other, and an insulation region arranged between the conductive pieces, the circuit board comprising:
- a first conductive piece to which the semiconductor element is fixed;
- a conductive sheet that is connected to a second conductive piece via a first connection portion and electrically connects a first terminal of the semiconductor element to the second conductive piece; and
- a second connection portion that is provided in the conductive sheet and electrically connects the first terminal and the second conductive piece.

2. The circuit board according to claim 1,
wherein the conductive sheet includes:
- a conductive portion that electrically connects the first terminal and the second conductive piece, and an insulation sheet that insulates the conductive portion from at least the first conductive piece; and wherein the second connection portion includes:

a recession portion formed such that the conductive portion is exposed therein, and an inner conductive portion that is provided inside the recession portion and electrically connects the conductive portion and the second conductive piece.

3. The circuit board according to claim 1, wherein the second connection portion is provided in a vicinity of the insulation region.

4. The circuit board according to claim 2, wherein the inner conductive portion is an annular portion formed on an inward surface of the recession portion.

5. The circuit board according to claim 2, wherein the inner conductive portion is solder that has been welded to the conductive portion and the second conductive piece.

6. The circuit board according to claim 4, wherein the conductive portion is plate-shaped.

7. The circuit board according to claim 1, wherein the conductive sheet is an FPC (Flexible Printed Circuit).

8. The circuit board according to claim 2, wherein the second connection portion is provided in a vicinity of the insulation region.

9. The circuit board according to claim 5, wherein the conductive portion is plate-shaped.

10. The circuit board according to claim 2, wherein the conductive sheet is an FPC (Flexible Printed Circuit).

11. The circuit board according to claim 3, wherein the conductive sheet is an FPC (Flexible Printed Circuit).

12. The circuit board according to claim 4, wherein the conductive sheet is an FPC (Flexible Printed Circuit).

13. The circuit board according to claim 5, wherein the conductive sheet is an FPC (Flexible Printed Circuit).

14. The circuit board according to claim 6, wherein the conductive sheet is an FPC (Flexible Printed Circuit).

* * * * *